(12) United States Patent
Govorkov et al.

(10) Patent No.: US 9,001,856 B1
(45) Date of Patent: Apr. 7, 2015

(54) DIODE LASER BAR MOUNTED ON A COPPER HEAT-SINK

(71) Applicant: Coherent, Inc., Santa Clara, CA (US)

(72) Inventors: Sergei Govorkov, Los Altos, CA (US); John H. Jerman, Palo Alto, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 14/221,152

(22) Filed: Mar. 20, 2014

(51) Int. Cl.
*H01S 3/04* (2006.01)
*H01S 5/024* (2006.01)
*H01S 5/022* (2006.01)

(52) U.S. Cl.
CPC ......... *H01S 5/02423* (2013.01); *H01S 5/02272* (2013.01)

(58) Field of Classification Search
USPC ..................................... 372/35, 36, 34, 50.12
See application file for complete search history.

(56) References Cited

U.S. PATENT DOCUMENTS 8,483,249 B1 * 7/2013 Govorkov et al. ............... 372/35
2005/0069266 A1 * 3/2005 Kouta et al. ..................... 385/92

OTHER PUBLICATIONS

Schleuning et al., Unpublished U.S. Appl. No. 13/662,620, filed Oct. 29, 2012, titled "Macro-Channel Water-Cooled Heat-Sink for Diode-Laser Bars", 31 pages.

* cited by examiner

*Primary Examiner* — Kinam Park
(74) *Attorney, Agent, or Firm* — Morrison & Foerster LLP

(57) ABSTRACT

A diode-laser bar package includes a water cooled metal heat-sink. An electrical-insulator-plate is bonded to the heat-sink with a soft solder. A metal sub-mount and a first electrode are bonded, spaced apart, on the electrical-insulator-plate. A solder-bridge fills the space between the first electrode and the sub-mount. A diode-laser bar is bonded to the sub-mount. A second electrode is bonded to the first electrode with an electrically insulating bond. Electrical connection between the second electrode and the diode-laser bar is made by a plurality of wire-bond electrical leads.

20 Claims, 1 Drawing Sheet

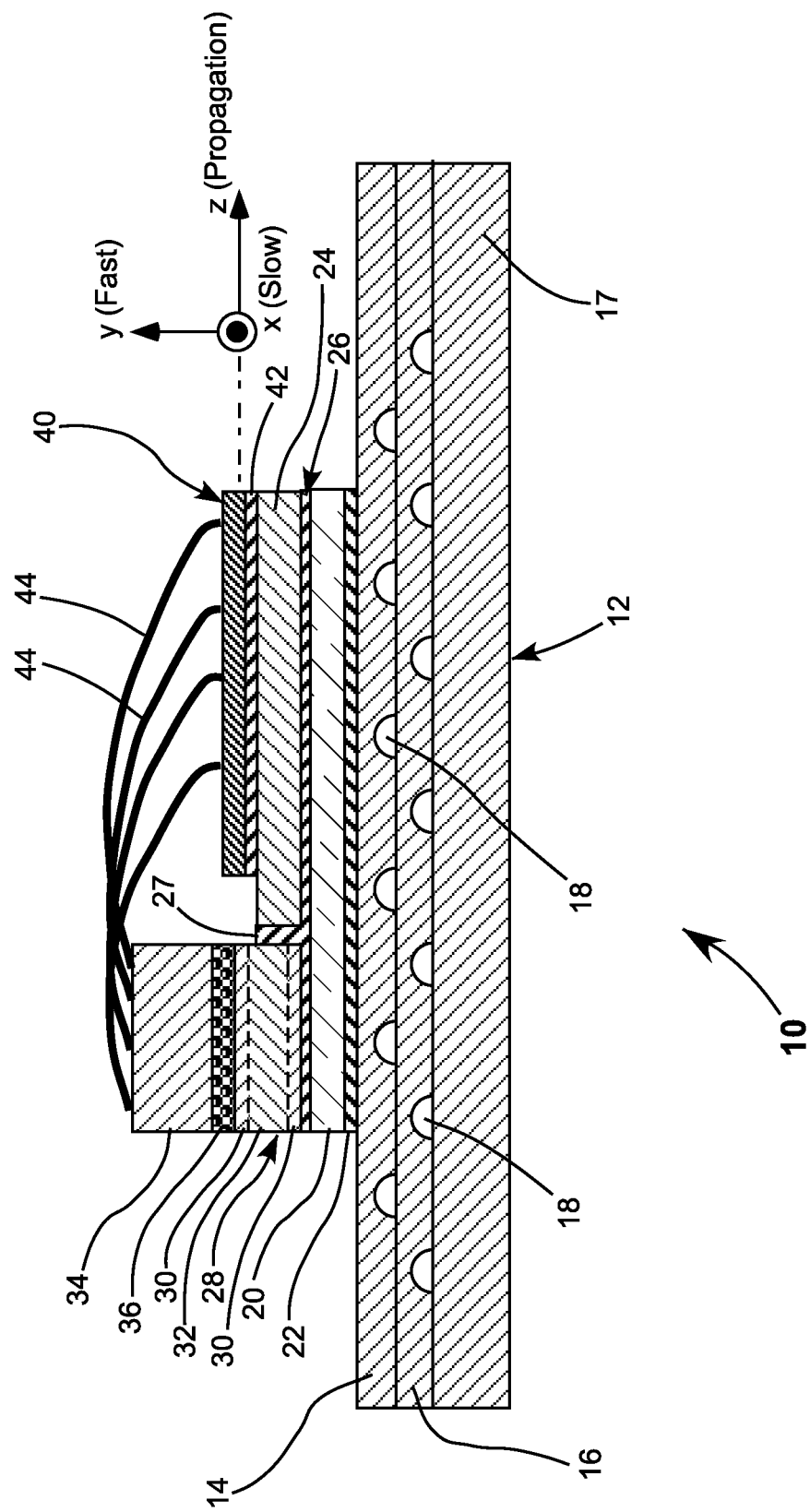

DIODE LASER BAR MOUNTED ON A COPPER HEAT-SINK

TECHNICAL FIELD OF THE INVENTION

The present invention relates in general to diode-laser bar packaging. The invention relates in particular to packaging diode-laser bars on a water-cooled heat-sink.

DISCUSSION OF BACKGROUND ART

The term "packaging" applied to diode-laser bars refers to mounting a diode-laser bar, or an array of diode-laser bars, on some sort of cooling-base or heat-sink. This base may be a relatively massive base providing a "conductively cooled package" (CCP). For higher power operation, the base is typically water-cooled, for example by a micro-channel arrangement.

A diode-laser bar includes a plurality of semiconductor layers epitaxially grown on a single-crystal substrate, with a plurality of diode-laser emitters defined in the epitaxial layers. Typically, the substrate is an n-type substrate, and layers are grown such that layers forming the "p-side" (anode-side) of the diodes are uppermost. The diode-laser bar is soldered "p-side down" either directly onto the heat-sink or via a sub-mount having a coefficient of thermal expansion (CTE) intermediate that of the substrate material and the heat-sink material, which is usually copper.

Electrical connection to the diode-laser bars places the heat-sink and cooling-water therein, in electrical contact with the diode-laser bar energizing circuit. In an array of diode-laser bars, the water can short-circuit electric connection to the bars unless the electrical conductivity of the water is low. A common solution to this is to use de-ionized (DI) or high-resistance water. However, DI water is more corrosive on metals than water from conventional building supplies, and the use of de-ionized water is expensive and inconvenient by comparison. There is a need for an improved water-cooled package for diode-laser bars that does not require the use of de-ionized water for the water-cooling.

SUMMARY OF THE INVENTION

The present invention is directed to a diode-laser bar package. In one aspect, a diode-laser bar package in accordance with the present invention comprises a metal heat-sink. An electrical-insulator-plate is bonded to the heat-sink with a soft solder. A metal sub-mount and a first electrode are bonded, spaced apart, on the electrical-insulator-plate using a hard solder, with that hard solder filling the space between the first electrode and the sub-mount. A diode-laser bar is bonded to the sub-mount with a hard solder. A second electrode bonded to the first electrode and insulated therefrom by a glass-filled epoxy bond. Electrical connection between the second electrode and the diode-laser bar is made by a plurality of wire bond electrical connections.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

THE DRAWING is a longitudinal cross-section view schematically illustrating a preferred embodiment of a diode-laser bar package in accordance with the present invention.

DETAILED DESCRIPTION OF THE INVENTION

THE DRAWING, schematically illustrates a preferred embodiment 10 of a diode-laser bar package in accordance with the present invention. The package includes a heat-sink 12, preferably formed from copper (Cu). Heat sink 12 includes serpentine water-cooling channels 18. The channels are formed by etching the channels in separate sheets 14 and 16 which are subsequently bonded together on a base-sheet 17. This method of forming channels allows the channels to be plated with an inert metal such as gold (Au) to inhibit corrosion.

Preferably the channels have a minimum cross-section dimension of about 0.3 millimeters (mm). A preferred cross-section dimension of the channels is about 1.2 mm wide by 0.6 mm high.

It should be noted here that only sufficient description of heat-sink 12 is provided for understanding principles of the present invention. This method of forming a water cooled heat-sink is well-known to practitioners of the art and a more detailed description is not necessary for describing inventive principles. Alternative cooling-channel forms or alternative construction methods for the heat-sink may be used without departing from the spirit and scope of the present invention.

An electrically insulating plate 20 is bonded to heat-sink 14 by a layer 22 of a soft solder. Preferred soft solders for the bonding are indium (In), tin/silver (SnAg), and SAC (an alloy predominantly of tin, with a small proportion of silver, and a lesser proportion of copper). Insulating plate 20 is made from an electrically insulating material with a high thermal conductivity. Beryllium oxide (BeO) is a particularly preferred such material. BeO has a thermal conductivity higher than that of all electrically insulating materials, except diamond and higher than that of many metals. The insulating plate is preferably metallized (sputtered or plated), for example, with gold, to facilitate solder-bonding.

An electrically conductive sub-mount plate (sub-mount) 24 is bonded to insulating plate 20 by a conductive hard solder layer 26. The term "hard solder" for purposes of this description and the appended claims refers to a eutectic Au(80%)Sn (20%) solder. Other examples are eutectic gold-silicon (AuSi) and gold-germanium (AuGe) but those are much less commonly used due to their higher liquidus temperatures. Soft solder for the purpose of this description and the appended claims means either pure indium or solders based primarily on indium, in composition with tin Sn, Ag, Cu, bismuth (Bi) among other elements. Another class of soft solders is SnAgCu solders of varying compositions commonly referred to in the art as SAC or lead-free solders. Lead-based solders are also soft solders, but the use of these is avoided or proscribed for environmental reasons.

A preferred hard solder for the bonding of sub-mount 24 is a gold-tin (Au/Sn) solder. A composite electrode 28 is also hard-solder-bonded to insulating plate 20 spaced apart from sub-mount 24. Soldering of the composite electrode and the sub-mount is effected such that the space between the composite electrode and the sub-mount is filled by a solder bridge 27. Conductive bridge 27 provides an effective electrical contact between sub-mount 24 and electrode 28.

A preferred material for sub-mount 24 is a copper-tungsten (CuW) alloy or composite (laminated sheets of copper and tungsten) having a thermal coefficient of expansion about matching that of single crystal gallium arsenide on which near infrared (NIR) diode laser bars are epitaxially grown. A preferred composite electrode 28 is formed form a center sheet 32 of molybdenum diffusion bonded between two sheets of copper 30. The molybdenum layer has a thickness four times that of the individual copper layers. This provides that the composite electrode has a thermal coefficient of expansion of about 6 ppm, about matching that of BeO, CuW, and GaAs. Such a composite material, having a thickness of about 0.7 mm, is commercially available from Torrey Hills Technologies Inc. of San Diego Calif. For composite materials the term thermal coefficient of expansion as used herein is an effective thermal coefficient of expansion.

A diode-laser bar 40 is bonded to sub-mount 24 by a hard-solder layer 42. As is well known in the art, a diode-laser bar is an array of diode-lasers epitaxially grown on a single crystal semiconductor substrate. The substrate is typically GaAs for diode-lasers emitting in a wavelength-range from about 800 nm to 100 nm. The diode-lasers are characterized as having a slow-axis, in which radiation is emitted with relatively low divergence, and a fast-axis (perpendicular to the fast- and slow-axes) in which radiation is emitted with relatively high-divergence. In a diode-laser bar, the diode-lasers are aligned in the slow-axis direction. The diode-lasers emit radiation in a propagation-axis (direction) perpendicular to the fast and slow axes. In THE DRAWING the slow-axis, fast-axis and propagation-axis of diode-laser bar 40 are designated the x-axis, y-axis, and z-axis.

When a diode-laser bar is bonded to a heat-sink or a thermally conductive sub-mount such as sub-mount 24, the bonding is made with epitaxially grown layers facing the heart-sink or sub-mount. As the layers are grown on the GaAs substrate from an n-doped to a p-doped side of the diode-lasers the bars are described as being mounted "p-side down" as discussed above. In this context, electrode 28 of package 10 serves as the p-electrode (positive electrode) for connecting power to the diode laser bar.

A negative electrode (n-electrode) 34 is bonded to positive electrode 28 by a layer of epoxy. Preferably, the epoxy is loaded particles of solid insulating material. Such particles maintain a preferred insulating-bond thickness even if shrinkage of the epoxy occurs in curing. This provides for adequate electrical insulation between the positive and negative electrodes. The can be glass or plastic beads or spheres or ceramic particles. One suitable loaded epoxy is H70 from Epoxy Technologies Inc. of Billerica Mass. This epoxy is loaded with 1% by weight of glass spheres having a diameter of 100 micrometers (μm). Connections 44 (only four shown in the drawing) make contact between n-electrode 34 and positions of individual diode-lasers (not shown) in diode-laser bar 40.

While the inventive diode-laser bar package is described above in a logical sequence from "bottom" to "top" this does not represent an assembly sequence. In a preferred assembly sequence, the heat-sink is separately assembled by soldering sheets thereof together. The GaAs diode-laser bar, the copper tungsten sub-mount, the BeO insulating plate and the copper-molybdenum-copper positive-electrode are bonded together as a sub-assembly. That subs-assembly is then bonded to the separately-assembled heat-sink. Following bonding of the sub-assembly to the heat-sink, the negative electrode is epoxy bonded on the positive electrode and individual wires are connected to corresponding diode-lasers (emitters) of the diode-laser bar. Other assembly (bonding) sequences may be used without departing from the spirit and scope of the present invention.

Insulating plate 22 of diode-laser bar package 10 provides that heat-sink 12 is completely electrically isolated from current supplied to the diode-laser bar. This provides that the heat sink can be cooled via channels 12 using only mains water, i.e., de-ionized water is not required. Using a soft solder bond for the insulating plate provides that differential expansion stresses between the diode-laser bar sub-assembly and the heat sink can be accommodated.

The use of hard solder in the diode-laser bar packaging provides for long-term reliability of high-power, high-current laser-diodes bars. It has been found that elements found in soft solders such as indium, tin and alloys thereof tend to migrate under conditions of high electrical current, or when subjected to strong temperature gradients, especially those due to repeated on-and-off cycling Such migration results in voids in solder joints, which eventually lead to thermal failures, or in parasitic growth of structures that obstruct light and cause electrical shorts. In the inventive package, hard solder is used in the entire electrical path and in joints that are exposed to strong temperature gradients. The soft solder necessary for compensating the thermal expansion mismatch between the diode-bar sub-assembly and the heat sink is outside the electrical path and in a position where heat is already spread over a relatively large area and temperature gradients have been reduced to a level less than that which would produce deterioration of the solder due to migration effects.

In summary, the present invention is described above with reference to a preferred embodiment. The invention is not limited, however, to the embodiment described and depicted. Rather the invention is limited only to the claims appended hereto.

What is claimed is:

1. Laser apparatus, comprising
a metal heat-sink;
an electrical-insulator-plate bonded to the heat-sink with a soft solder;
a metal sub-mount and a first electrode bonded, spaced apart, on the electrical-insulator-plate using a hard solder, with that hard solder filling the space between the first electrode and the sub-mount;
a diode-laser bar bonded to the sub-mount with a hard solder;
a second electrode bonded to the first electrode and insulated therefrom by an epoxy bond; and
a plurality of wire-bond electrical connections between the second electrode and the diode-laser bar.

2. The apparatus of claim 1, wherein the heat sink is a water-cooled heat sink having a plurality of cooling channels forming a water cooling circuit therein.

3. The apparatus of claim 2, wherein the cooling channels have as minimum cross-section dimension of about 0.3 millimeters.

4. The apparatus of claim 1, wherein the electrical-insulator-plate is a beryllium oxide plate.

5. The apparatus of claim 1, wherein the sub-mount is made from one of a copper-tungsten alloy and a copper-tungsten composite.

6. The apparatus of claim 1, wherein the diode-laser bar has a gallium arsenide substrate.

7. The apparatus of claim 1, wherein the first electrode is made from a fusion-bonded assembly of copper and molybdenum sheets.

8. The apparatus of claim 1, wherein the hard solder is a hard solder selected from the group of hard solders consisting of gold-tin solder, gold-silicon solder, and gold-germanium solder.

9. The apparatus of claim 8, wherein the hard solder is a gold-tin solder.

10. The apparatus of claim 1, wherein the soft solder is a soft solder is indium or an alloy thereof.

11. The apparatus of claim 1, wherein the soft solder is one of a tin-silver solder and a tin-silver-copper solder.

12. The apparatus of claim 1, wherein the epoxy bond is filled with particles of electrically insulating material.

13. The apparatus of claim 12, wherein the particles of electrically insulating material are glass spheres.

14. Laser apparatus, comprising
   a copper heat-sink;
   a beryllium oxide electrical-insulator-plate bonded to the heat-sink with a soft solder;
   a copper tungsten sub-mount and a first electrode bonded, spaced apart, on the electrical-insulator-plate using a hard solder, with that hard solder filling the space between the first electrode and the sub-mount;
   a diode-laser bar on a gallium arsenide substrate bonded to the sub-mount with a hard solder;
   a second electrode formed from a copper-molybdenum-copper composite bonded to the first electrode and insulated therefrom by a glass-filled epoxy bond; and
   a plurality of wire-bond electrical connections between the second electrode and the diode-laser bar.

15. The apparatus of claim 14, wherein the heat sink is a water-cooled heat sink having a plurality of cooling channels forming a water-cooling circuit therein.

16. The apparatus of claim 15, wherein the cooling channels have as minimum cross-section dimension of about 0.3 millimeters.

17. The apparatus of claim 14, wherein the hard solder is a hard solder selected from the group of hard solders consisting of gold-tin solder, gold-silicon solder, and gold-germanium solder.

18. The apparatus of claim 17, wherein the hard solder is a gold-tin solder.

19. The apparatus of claim 14, wherein the soft solder is indium or an alloy thereof.

20. The apparatus of claim 14, wherein the soft solder is one of a tin-silver solder and a tin-silver-copper solder.

\* \* \* \* \*